US006777991B2

(12) United States Patent
Murakami

(10) Patent No.: US 6,777,991 B2
(45) Date of Patent: Aug. 17, 2004

(54) METHOD AND APPARATUS FOR STABLE PHASE-LOCKED LOOPING

(75) Inventor: Hideaki Murakami, Hyogo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/681,876

(22) Filed: Oct. 9, 2003

(65) Prior Publication Data

US 2004/0080342 A1 Apr. 29, 2004

Related U.S. Application Data

(63) Continuation of application No. 10/232,448, filed on Aug. 28, 2002, now Pat. No. 6,664,861.

(30) Foreign Application Priority Data

Aug. 29, 2001 (JP) ........................................ 2001-259642

(51) Int. Cl.[7] ................................................. H03L 7/06
(52) U.S. Cl. ....................................................... 327/156
(58) Field of Search ................................ 327/147, 148, 327/149, 150, 156, 157, 158, 159; 331/57

(56) References Cited

U.S. PATENT DOCUMENTS

| 5,410,278 A | 4/1995 | Itoh et al. |
| 5,544,120 A | 8/1996 | Kuwagata et al. |
| 6,549,082 B2 | 4/2003 | Ipek et al. |

Primary Examiner—Jeffrey Zweizig
(74) Attorney, Agent, or Firm—Cooper & Dunham LLP

(57) ABSTRACT

A phase-locked loop apparatus includes a ring oscillator including inverters, first and second transistors, a converter, mirror circuits. The first transistors control a current from a first voltage to the inverters. The second transistors control a current from the inverters. The converter converts the voltage output from the filter into a current. The first mirror circuit outputs a current in accordance with the current output from the converters. The second mirror circuit outputs a current according to the current output from the first mirror circuit to control the first transistors. The third mirror circuit outputs a current according to the current output from the second mirror circuit to control the second transistors. The converter, the first and second mirror circuits operate with a second voltage greater than the first voltage, and the ring oscillator and the third mirror circuit operate with the first voltage.

14 Claims, 6 Drawing Sheets

METHOD AND APPARATUS FOR STABLE PHASE-LOCKED LOOPING

This application is a continuation of application Ser. No. 10/232,448, filed Aug. 28, 2002 now U.S. Pat. No. 6,664,861.

BACKGROUND

1. Field

This patent disclosure relates to phase-locked loops, and more particularly to a method and apparatus for phase-locked looping capable of stably operating with reduced adverse effects including jitters.

2. Discussion

In recent years, designers have sought to reduce the electrical power needs of electric equipment. Accordingly, the power applied to a PLL (phase-locked loop) circuit should be decreased as well.

FIG. 1 shows an exemplary circuit of a known VCO (voltage-controlled oscillator) 100 having a power source Vdd. In FIG. 1, the VCO 100 includes a ring oscillator 101, PMOS (P-channel metal oxide semiconductor) transistors P1–Pm, and NMOS (N-channel metal oxide semiconductor) transistors N1–Nm. The suffixes m of the PMOS and NMOS transistors Pm and Nm are an odd integers greater than 1. Further the VCO 100 includes a voltage-to-current conversion circuit 105, a first current mirror circuit 106, a second current mirror circuit 107, a third current mirror circuit 108, an NMOS (N-channel metal oxide semiconductor) transistor 109, and a constant current source 110.

The ring oscillator 101 includes inverter circuits IV1–IVm which form a delay circuit, wherein a suffix m is an odd integer greater than 1. The inverter circuits IV1–IVm are connected in a ring form. Each of the inverter circuits IV1–IVm of the ring oscillator 101 is composed of a pair of PMOS (P-channel metal oxide semiconductor) and NMOS (N-channel metal oxide semiconductor) transistors connected in series. The PMOS transistors P1–Pm are correspondingly connected to the inverter circuits IV1–IVm, respectively, and control a current flowing to a positive side power source terminal of the inverter circuits IV1–IVm from a direct current power source (not shown). The NMOS transistors N1–Nm are correspondingly connected to the inverter circuit IV1–IVm, respectively, and control a current flowing to a common ground from a negative side power source terminal of the inverter circuits IV1–IVm.

The voltage-to-current conversion circuit 105 includes an operational amplifier 102, an NMOS (N-channel metal oxide semiconductor) transistor 103, and a resistor 104. The operational amplifier 102 is configured to have a negative feedback, and outputs the input voltage VCOIN to a gate terminal of the NMOS transistor 103. Such operational amplifier 102 operates such that the voltage at the junction of the NMOS transistor 103 and the resistor 104 is substantially equal to the input voltage VCOIN. The current converted by the voltage-to-current conversion circuit 105 flows through the first, second, and third current mirror circuits 106, 107, and 108 and through the NMOS transistor 109.

The NMOS transistor 109 forms a current mirror circuit with each of the NMOS transistors N1–Nm and therefore, a current in accordance with the current output from the third current mirror circuit 108 flows through each of the NMOS transistors N1–Nm. The PMOS transistor 115 of the third current mirror circuit 108 forms a current mirror circuit with each of the PMOS transistors P1–Pm, and therefore each of the PMOS transistors P1–Pm supplies a current to a positive side power source terminal of corresponding one of the inverter circuits IV1–IVm in accordance with the current output from the second current mirror circuit 107.

In this way, a current flowing through each of the inverter circuits IV1–IVm can be controlled. That is, a delay time by each of the inverter circuits IV1–IVm can be controlled with using the input voltage VCOIN. Thereby, the VCO 100 can change the frequency of a signal SOUT output from the ring oscillator 101 with the input voltage VCOIN. In this type of PLL circuit, the oscillating frequency of the ring oscillator 101 is determined by the performances of the voltage-to-current conversion circuit 105 and the PMOS transistor 115. In particular, a minimum oscillating frequency of the ring oscillator 101 is determined by a resistance value of the resistor 104 provided to the voltage-to-current conversion circuit 105.

However, with the structure of the VCO 100, the frequency of the signal SOUT output from the ring oscillator 101 is not always linear, as seen in FIG. 2. More specifically, when the input voltage VCOIN is close to the power source voltage Vdd, the frequency of the signal SOUT linearly changes to an extent of a value obtained by subtracting a threshold voltage of the PMOS transistor 111 from the power source voltage Vdd.

That is, in a PLL circuit including the VCO 100 having a frequency characteristic shown in FIG. 2, the output frequency of the VCO 100 is linear relative to the input voltage VCOIN only in a narrow voltage range.

Therefore, it is needed to increase a gain of the VCO 100. However, if the gain of the VCO is increased, a variation of the output frequency per input voltage becomes greater and consequently the PLL circuit will have a greater jitter. As a result, the PLL decreases its performance.

In FIG. 2, a line A1 represents the frequency of the signal SOUT linearly increasing from a value greater than 0 as the input voltage VCOIN increases when a constant current source 110 is provided to the VCO 100, as shown in FIG. 1. A line A2 represents the frequency of the signal SOUT which linearly increases from 0, i.e., the ground level, when the constant current source 110 is not provided the VCO 100.

Generally, an area requiring a relatively high voltage remains in an input and output portion associated with an external component even in a process having a decreased source voltage. In such an area, a transistor having a relatively low performance but suitable for a high voltage use is applied. Under this circumstance, one method for preventing a PLL circuit from the degradation of its performance with an increasing jitter is to maintain a voltage of the whole PLL circuit at a high level by using a transistor for a high voltage use. In this method, however, a level shifter is needed between the PLL circuit and an internal logic circuit to be connected to the PLL circuit and therefore the PLL circuit will degrade in a duty cycle and a jitter.

SUMMARY

This patent specification describes a novel phase-locked loop apparatus. In one example, a novel phase-locked loop apparatus includes a comparator, a filter, and a voltage-controlled oscillator. The comparator is configured to compare phases of a reference clock signal and an output signal of the apparatus and to output a voltage in accordance with a difference in phase as a comparison result. The filter is configured to integrate the voltage output from the comparator. The voltage-controlled oscillator is configured to control a frequency of an output signal in accordance with the voltage output from the filter. This voltage-controlled oscillator includes a ring oscillator, a plurality of first transistors, a plurality of second transistors, a voltage-to-current converter, a first current mirror circuit, a second current mirror circuit, and a third current mirror circuit. The ring oscillator is configured to include a delay circuit including a plurality of inverters connected in a ring form. The plurality of first transistors correspond to the plurality of inverters of the ring oscillator on a one-to-one basis and are configured to control a current supplied by a first power source voltage to a positive side power source terminal of each of the plurality of inverters. The plurality of second transistors correspond to the plurality of inverters of the ring oscillator on a one-to-one basis and are configured to control a current output from a negative side power source terminal of each of the plurality of inverters. The voltage-to-current converter is configured to convert the voltage output from the filter into a current. The first current mirror circuit is configured to output a current in accordance with the current output from the voltage-to-current converter. The second current mirror circuit is configured to output a current in accordance with the current output from the first.current mirror circuit to a control signal input terminal of each of the plurality of first transistors. The third current mirror circuit is configured to output a current in accordance with the current output from the second current mirror circuit to a control signal input terminal of each of the plurality of second transistors. In this apparatus, the voltage-to-current converter, the first and second current mirror circuits operate with a second power source voltage greater than the first power source voltage, and the ring oscillator and the third current mirror circuit operate with the first power source voltage.

The voltage-to-current converter may include a transistor and resistor series circuit and an operational amplifier. The transistor and resistor series circuit includes a transistor and a resistor in series and configured to convert an input voltage into a current. The operational amplifier has a non-inverse terminal receiving the voltage output from the filter and an inverse terminal connected to an output terminal of the transistor of the transistor and resistor series circuit to form a negative feedback circuit. The operational amplifier is configured to control an operation of the transistor of the transistor and resistor series circuit.

The voltage-to-current converter may include a constant current source configured to supply a predetermined constant current to the first current mirror circuit.

The third current mirror circuit may include a transistor with which each of the plurality of first transistors forms a current mirror circuit.

The voltage-to-current converter may include a third transistor configured to form a current mirror circuit with each of the plurality of second transistors and to receive a current output from the third current mirror circuit.

This patent specification further describes another novel phase-locked loop apparatus which in one example, includes a comparator, a filter, and a voltage-controlled oscillator. The comparator is configured to compare phases of a reference clock signal and an output signal of the apparatus and to output a voltage in accordance with a difference in phase as a comparison result. The filter is configured to integrate the voltage output from the comparator. The voltage-controlled oscillator is configured to control a frequency of an output signal in accordance with the voltage output from the filter, the voltage-controlled oscillator comprising a ring oscillator, a VCO, and first, second and third current mirror circuits. The ring oscillator is configured to include a delay circuit including a plurality of differential amplifiers connected in a ring form. Each of the plurality of differential amplifier includes a first transistor for controlling a current supplied to a corresponding one of the plurality of differential amplifiers by a first power source voltage and a second transistor for controlling a current output from a corresponding one of the plurality of differential amplifiers. The voltage-to-current converter (VCO)is configured to convert the voltage output from the filter into a current. The first current mirror circuit is configured to output a current in accordance with the current output from the voltage-to-current converter. The second current mirror circuit is configured to output a current in accordance with the current output from the first current mirror circuit to a control signal input terminal of the first transistor included in each of the plurality of differential amplifiers. The third current mirror circuit is configured to output a current in accordance with the current output from the second current mirror circuit to a control signal input terminal of the second transistor included in each of the plurality of differential amplifiers. In this apparatus, the voltage-to-current converter, the first and second current mirror circuits operate with a second power source voltage greater than the first power source voltage, and the ring oscillator and the third current mirror circuit operate with the first-power source voltage.

This patent specification further describes a novel method of phase-locked looping. In one example, the novel method including the steps of providing, comparing, generating, integrating, converting, first mirroring, second mirroring, third mirroring, first applying, and second applying. The providing step provides a ring oscillator including a plurality of inverters connected in a ring form. The comparing step compares phases of a reference clock signal and an output signal of the apparatus. The generating step generates a voltage in accordance with a difference in phase as a comparison result. The integrating step integrates the voltage output from the generating step. The converting step converts the voltage output from the integrating step into a current. The first mirroring step mirrors the current converted in the converting step to output a current in accordance with the current output from the converting step. The second mirroring step mirrors the current output in the first mirroring step to output a first current in accordance with the current output in the first mirroring step. The third mirroring step mirrors the current output in the second mirroring step to output a second current in accordance with the current output from the second mirroring step. The first applying step applies the first current output in the second mirroring step to a plurality of first transistors corresponding to the plurality of invertors of the ring oscillator on a one-to-one basis to control a current supplied by a first power source voltage to a positive side power source terminal of each of the plurality of invertors. The second applying step applies the second current output in the third mirroring step to a plurality of second transistors corresponding to the plurality of invertors of the ring oscillator on a one-to-one basis to control a current output from a negative side power source terminal of each of the plurality of invertors. In this apparatus, the converting step, the first and second mirroring steps operate with a second power source voltage greater than the first power source voltage, and the ring oscillator and the third mirroring step operate with the first power source voltage.

This patent specification further describes another novel method of phase-locked looping which, in one example, includes the step of providing, comparing, generating, integrating, converting, first mirroring, second mirroring, third mirroring, first applying, and second applying. The providing step provides a ring oscillator including a plurality of differential amplifiers connected in a ring form. Each of the plurality of differential amplifiers includes first and second transistors. The comparing step compares phases of a reference clock signal and an output signal of the apparatus. The generating step generates a voltage in accordance with a difference in phase as a comparison result. The integrating step integrates the voltage output from the generating step. The converting step converts the voltage output from the integrating step into a current. The first mirroring step mirrors the current converted in the converting step to output a current in accordance with the current output from the converting step. The second mirroring step mirrors the current output in the first mirroring step to output a first current in accordance with the current output in the first mirroring step. The third mirroring step mirrors the current output in the second mirroring step to output a second current in accordance with the current output from the second mirroring step. The first applying step applies the first current output in the second mirroring step to the first transistor included in each of the plurality of differential amplifiers of the ring oscillator to control a current supplied by a first power source voltage to each of the plurality of differential amplifiers. The second applying step applies the second current output in the third mirroring step to the second transistor included in each of the plurality of differential amplifiers of the ring oscillator to control a current output from a negative side power source terminal of each of the plurality of differential amplifiers. In this apparatus, the converting step, the first and second mirroring steps operate with a second power source voltage greater than the first power source voltage, and the ring oscillator and the third mirroring step operate with the first power source voltage.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
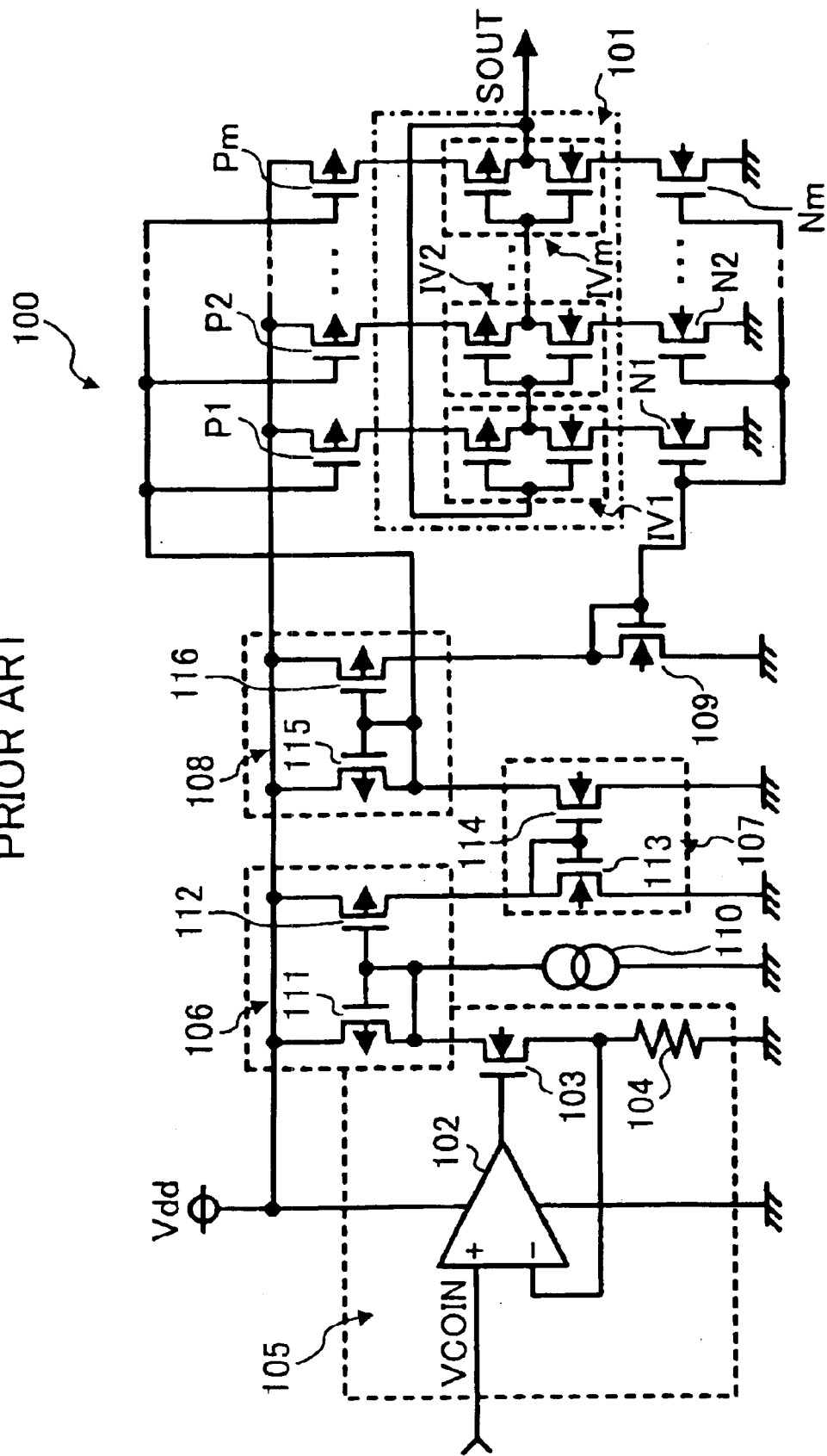
FIG. 1 is a schematic diagram of a known PLL circuit.
Figure 2:
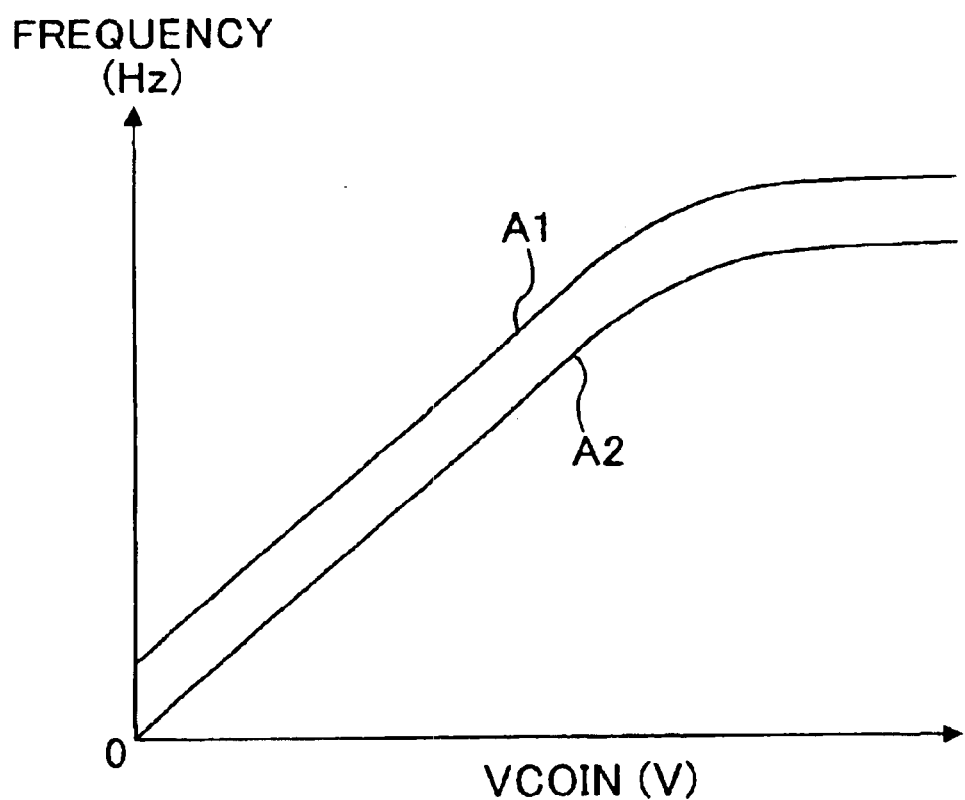
FIG. 2 is a graph for explaining a frequency change curve performed by the known PLL circuit.
Figure 3:
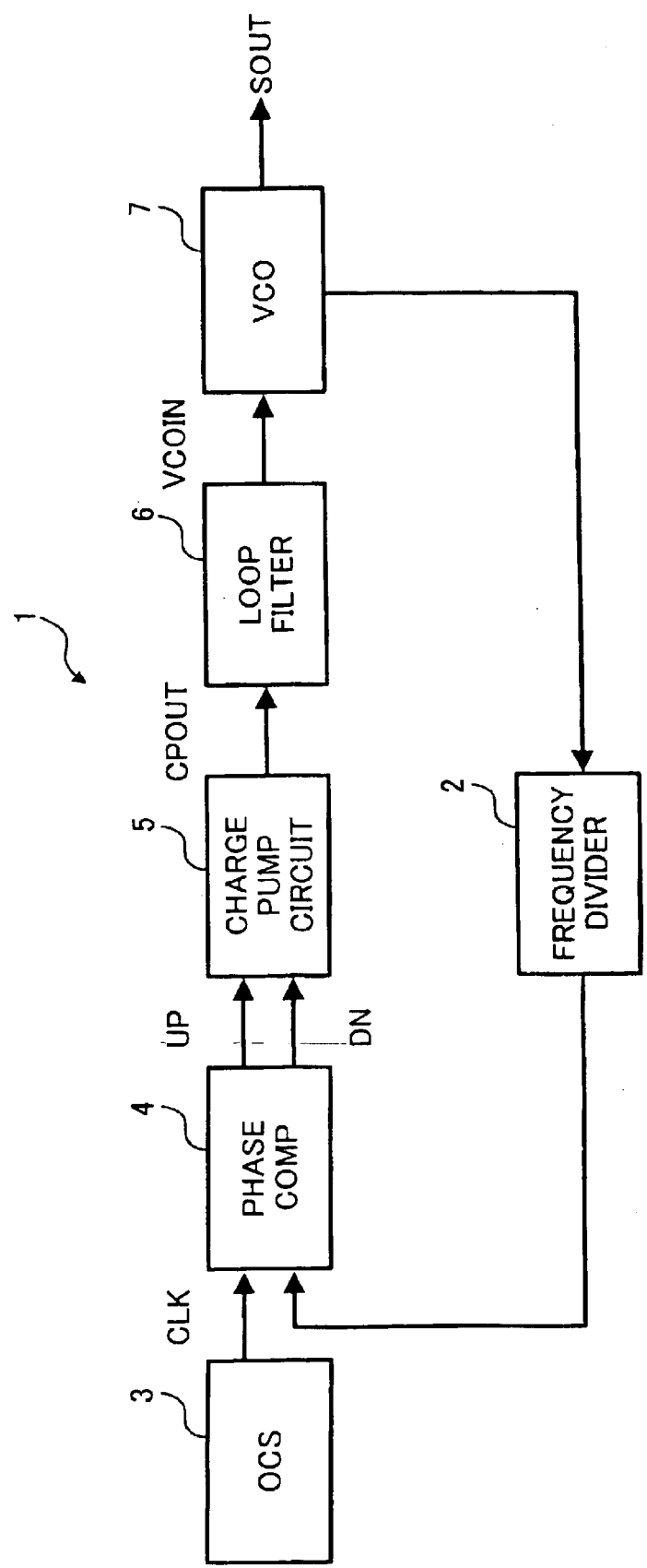
FIG. 3 is a block diagram of an exemplary PLL circuit according to a preferred embodiment.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 3, a description is given of a PLL (phase-locked loop) circuit 1 according to a preferred embodiment. FIG. 3 shows a block diagram of the PLL circuit 1 which includes a frequency divider 2, an oscillator (OSC) 3, a phase comparator (PHASE COMP) 4, a charge pump circuit 5, a loop filter 6, and a VCO (voltage controlled oscillator) 7.

In the PLL circuit 1 of FIG. 3, the frequency divider 2 determines a frequency of the PLL circuit 1. The oscillator 3 outputs a clock signal CLK having a predetermined frequency. The phase comparator 4 compares the phases of the clock signal CLK and an output of the VCO 7 which is frequency-divided by the frequency divider 2, and outputs one of predetermined control signals UP and DN representing comparison results to the charge pump circuit 5.

More specifically, the phase comparator 4 compares rising edges of the clock signal CLK and the output of the frequency divider 2 and, when the edge of the clock signal CLK is input to the phase comparator 4 earlier than the edge of the output from the frequency divider 2, the comparator 4 outputs the control signal UP until the edge of the output from the frequency divider 2 is input. When the edge of the output from the frequency divider 2 is input earlier than the edge of the clock signal CLK, the phase comparator 4 outputs the control signal DN until the edge of the clock signal CLK is input.

The charge pump circuit 5 outputs a signal CPOUT to the loop filter 6 during a time that the phases of the clock signal CLK and the output of the frequency divider 2 differ. The signal CPOUT output from the charge pump circuit 5 has a high level or a low level in accordance with the input control signal UP or DN, respectively. The charge pump circuit 5 keeps its output terminal in a state of a high impedance when neither the control signal UP or DN is input.

The loop filter 6 obtains a voltage VCOIN by integrating the signal CPOUT sent from the charge pump circuit 5 and outputs the voltage VCOIN to the VCO 7. The VCO 7 outputs a signal SOUT having a frequency in accordance with the voltage VCOIN sent from the loop filter 6. The frequency divider 2 divides the frequency of the signal SOUT at a predetermined ratio and outputs a resultant signal to the phase comparator 4. The phase comparator 4, as described above, compares the phases of the clock signal CLK and the output from the frequency divider 2. In this way, the PLL circuit 1 decreases the voltage VCOIN input to the VCO 7 when the phase of the signal SOUT leads the phase of the clock signal CLK and increases when the signal SOUT lags behind the clock signal CLK.

Figure 4:
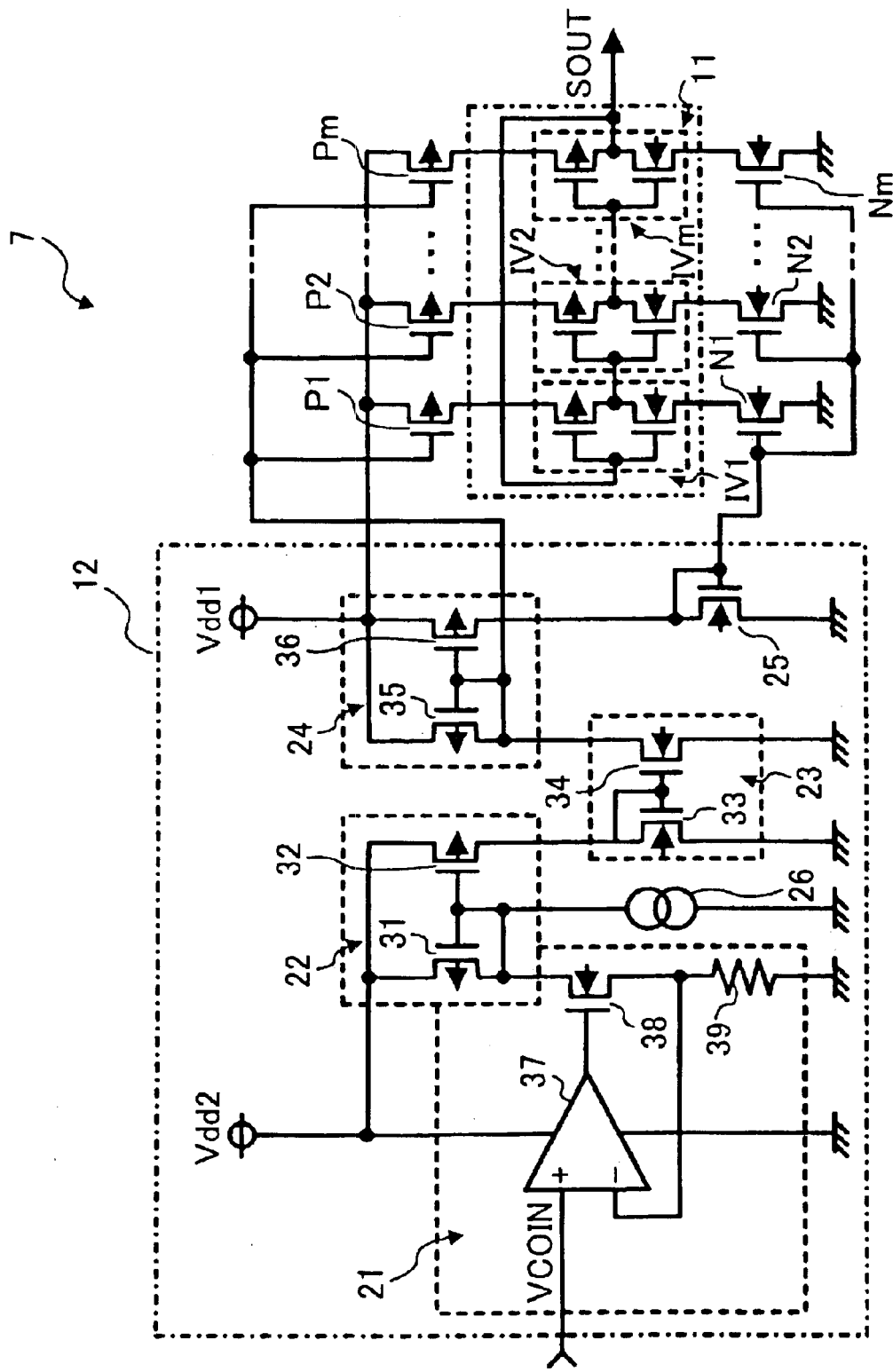
FIG. 4 is a schematic diagram of the PLL circuit of FIG. 3.

Next, details of the VCO 7 are explained with reference to FIG. 4. As shown in FIG. 4, the VCO 7 includes a ring oscillator 11, PMOS (P-channel metal oxide semiconductor) transistors P1–Pm, NMOS (N-channel metal oxide semiconductor) transistors N1–Nm, and a bias current determining circuit 12. The suffixes m of the PMOS and NMOS transistors Pm and Nm are odd integers greater than 1.

The ring oscillator 11 includes inverter circuits IV1–IVm which form a delay circuit, wherein a suffix m is an odd integer greater than 1. The inverter circuits IV1–IVm are connected in a ring form. Each of the inverter circuits IV1–IVm of the ring oscillator 11 is composed of a pair of PMOS (P-channel metal oxide semiconductor) and NMOS (N-channel metal oxide semiconductor) transistors connected in series. The PMOS transistors P1–Pm are correspondingly connected to the inverter circuits IV1–IVm, respectively, and control a current flowing to the inverter circuits IV1–IVm from a first direct current power source (not shown) having a first power source voltage Vdd1. The NMOS transistors N1–Nm are correspondingly connected to the inverter circuit IV1–IVm, respectively, and control a current flowing to a common ground from the inverter circuits IV1–IVm.

In this circuit, each of the PMOS transistors P1–Pm is referred to as a first transistor and each of the NMOS transistors N1–Nm is a second transistor. In addition, an NMOS (N-channel metal oxide semiconductor) transistor 25 (explained later) of the bias current determining circuit 12 is referred to as a third transistor.

The bias current determining circuit 12 controls operations of the PMOS transistors P1–Pm and the NMOS transistors N1–Nm in accordance with the input voltage VCOIN from the loop filter 6. By this control, a bias current relative to each of the inverter circuits IV1–IVm of the ring oscillator 11 is controlled such that a frequency control with respect to the output signal SOUT is executed.

This bias current determining circuit 12 includes a voltage-to-current conversion circuit 21, a first current mirror circuit 22, a second current mirror circuit 23, a third current mirror circuit 24, the NMOS transistor 25, and a constant current source 26. The voltage-to-current conversion circuit 21 converts the input voltage VCOIN into a current. The first current mirror circuit 22 includes PMOS (P-channel metal oxide semiconductor) transistors 31 and 32. The second current mirror circuit 23 includes NMOS (N-channel metal oxide semiconductor) transistors 33 and 34. The third current mirror circuit 24 includes PMOS (P-channel metal oxide semiconductor) transistors 35 and 36.

The input voltage VCOIN is converted into a current by the voltage-to-current conversion circuit 21 and the converted current flows through the first, second, and third current mirror circuits 22, 23, and 24 and the NMOS transistor 25. The NMOS transistor 25 forms a current mirror circuit with each of the NMOS transistors N1–Nm and therefore, in accordance with the current output from the third current mirror circuit 24, a current flows from a negative side power source terminal of each of the inverter circuits IV1–IVm to the common ground through corresponding one of the NMOS transistors N1–Nm.

The PMOS transistor 35 of the third current mirror circuit 24 forms a current mirror circuit with each of the PMOS transistors P1–Pm, and therefore each of the PMOS transistors P1–Pm supplies a current to a positive side power source terminal of corresponding one of the inverter circuits IV1–IVm in accordance with the current output from the second current mirror circuit 23. In this way, a current flowing through each of the inverter circuits IV1–IVm can be controlled. That is, a delay time by each of the inverter circuits IV1–IVm can be controlled with using the input voltage VCOIN.

The voltage-to-current conversion circuit 21 includes an operational amplifier 37, an NMOS (N-channel metal oxide semiconductor) transistor 38, and a resistor 39. The operational amplifier 37 receives an electric power from a second direct current power source (not shown) for outputting a second power source voltage Vdd2. The second power source voltage Vdd2 supplied by the second direct current power source is greater than the first power source voltage Vdd1 supplied by the first direct current power source. The operational amplifier 37 has a non-inverse input terminal for receiving the input voltage VCOIN and an inverse input terminal connected to a junction of the NMOS transistor 38 and the resistor 39. This operational amplifier 37 outputs a signal to a gate terminal of the NMOS transistor 38. The NMOS transistor 38 and the resistor 39 in series are inserted between the PMOS transistor 31 of the first current mirror circuit 22 and the common ground.

In the first current mirror circuit 22, the PMOS transistor 31 is connected between the second power source voltage Vdd2 and the NMOS transistor 38 of the voltage-to-current conversion circuit 21. The PMOS transistor 31 has a gate terminal connected to its own drain terminal and to a gate terminal of the PMOS transistor 32. Between this gate terminal of the PMOS transistor 31 and the common ground, the constant current source 26 is connected. The PMOS transistor 32 is connected between the second power source voltage Vdd2 and the NMOS transistor 33 of the second current mirror circuit 23.

In the second current mirror circuit 23, the NMOS transistor 33 is connected between the PMOS transistor 32 and the common ground. The NOMS transistor 33 has a gate terminal connected to its own drain terminal and to a gate terminal of the NMOS transistor 34 which is connected between the PMOS transistor 35 of the third current mirror circuit 24 and the common ground.

In the third current mirror circuit 24, the PMOS transistor 35 is connected between the first power source voltage Vdd1 and the NMOS transistor 34 of the second current mirror circuit 23. The PMOS transistor 35 has a gate terminal connected to its own drain terminal and to a gate terminal of the PMOS transistor 36. The gate terminal of the PMOS transistor 35 is further connected to a gate terminal of each of the PMOS transistors P1–Pm. The PMOS transistor 36 and the NMOS transistor 25 in series are connected between the first power source voltage Vdd1 and the common ground.

The NMOS transistor 25 has a gate terminal connected to its own drain terminal and to a gate terminal of each of the NMOS transistors N1–Nm.

Thus, the VCO 7 is configured to separately receive a high power source voltage (i.e., the second power source voltage Vdd2) and a low power source voltage (i.e., the first power source voltage Vdd1). The voltage-to-current conversion circuit 21, the first current mirror circuit 22, and the second current mirror circuit 23 are referred to as circuits of a high power source voltage system to be driven by the second power source voltage Vdd2. The third current mirror circuit 24, the NMOS transistor 25, the NMOS transistors N1–Nm, the PMOS transistors P1–Pm, and the ring oscillator 11 are referred to as circuits of a low power source voltage system to be driven by the first power source voltage Vdd1. The operational amplifier 37 forms a negative feedback circuit so that the voltage at the junction between the NMOS transistor 38 and the resistor 39 is substantially equal to the input voltage VCOIN.

As described above, in the VCO 7, the input voltage VCOIN is input to the non-inverse input terminal of the operational amplifier 37 and the inverse input terminal of the operational amplifier 37 is connected to the high voltage side node of the resistor 39. Therefore, the operational amplifier 37 performs a negative feedback such that the non-inverse input terminal and the inverse input terminal have substantially no difference in voltage. As a consequence, a current proportional to the input voltage VCOIN flows through the resistor 39. Such current flow proportional to the input voltage VCOIN through the resistor 39 is executed even when the input voltage VCOIN is increased up to the first power source voltage Vdd1. This is because the voltage-to-current conversion circuit 21 is a circuit of the high power source voltage system driven by the high power source voltage (i.e., the second power source voltage Vdd2) and the input voltage VCOIN is input from a circuit of the low power source voltage system driven by the low power source voltage (i.e., the first power source voltage Vdd1).

In addition, since the constant current source 26 is provided aside from the negative feedback circuit of the operational amplifier 37, a predetermined current flows through the first current mirror circuit 22 even when the input voltage VCOIN is 0. The predetermined current flowing through the first current mirror circuit 22 is transmitted through the second current mirror circuit 23 to the third current mirror circuit 24 driven by the low power source voltage, i.e., the first power source voltage Vdd1. Accordingly, a current substantially equal to the current converted from the input voltage VCOIN by the voltage-to-current conversion circuit 21 flows through the PMOS transistors 35 and 36 of the third current mirror circuit 24. The PMOS transistors 35 and 36 are the circuits for the low power source voltage, i.e., the first power source voltage Vdd1, and the first power source voltage Vdd1 is actually applied to the sources of the PMOS transistors 35 and 36. Therefore, no excessive voltage is applied to the sources and drains of the PMOS transistors 35 and 36.

Figure 5:
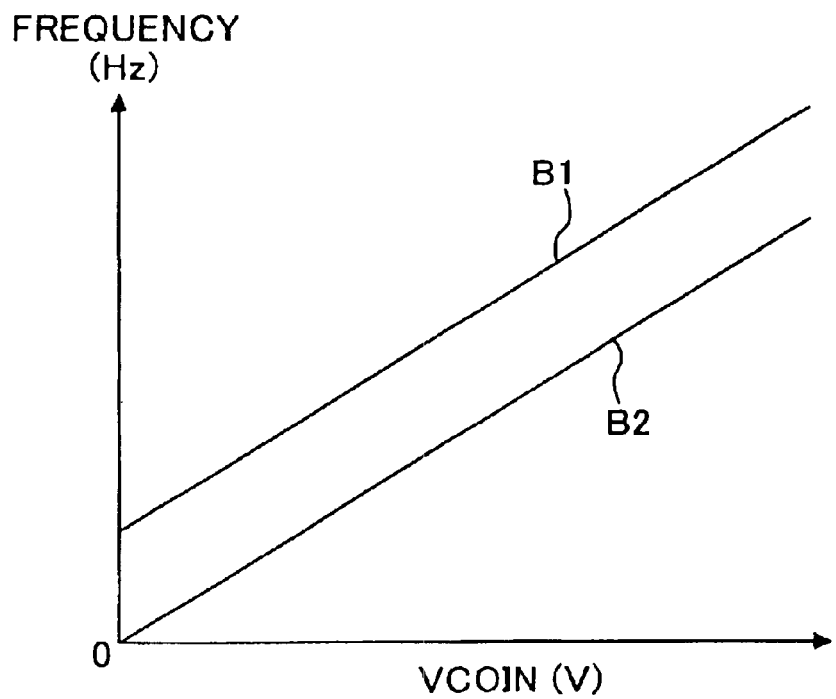
FIG. 5 is a graph for explaining a frequency change curve performed by the PLL circuit shown in FIG. 3.

Subsequently, the current proportional to the input voltage VCOIN is transmitted as a bias current to each of the inverter circuits IV1–IVm of the ring oscillator 11, and the ring oscillator 11 thereby has an output frequency proportional to the input voltage VCOIN, as shown in a graph of FIG. 5. The constant current source 26 determines a default frequency value of the signal SOUT and therefore it may not needed when a desired frequency band is not specified. In the graph of FIG. 5, the horizontal axis represents the input voltage VCOIN and the vertical axis represents a frequency of the signal SOUT. That is, a line B1 represents the frequency of the signal SOUT linearly increasing from a value greater than 0 as the input voltage VCOIN increases when the constant current source 26 is provided to the bias current determining circuit 12, as shown in FIG. 4. Further, a line B2 represents the frequency of the signal SOUT which linearly increases from 0, i.e., the ground level, when the constant current source 26 is not provided.

Therefore, the VCO 7 gain characteristic that prevents or at least reduces degradation of the performance of the PLL circuit 1.

Figure 6A:
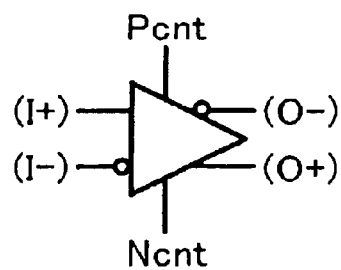
FIGS. 6A and 6B are schematic diagrams of a differential amplifier.
Figure 6B:
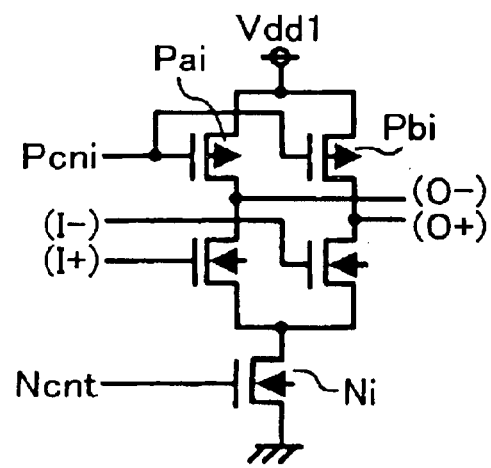

In the VCO 7, the ring oscillator 11 has the delay circuit composed of the pairs of the PMOS and NMOS transistors connected in series. As an alternative, the delay circuit may be implemented by a differential amplifier arranged to have an output amplitude level substantially equal to a voltage amplitude of the power source. An example of this differential amplifier is shown in FIG. 6A and, with such a differential amplifier, the ring oscillator becomes resistant to noise. FIG. 6B is an actual circuit equivalent to the differential amplifier shown in FIG. 6A. In the differential amplifier of FIG. 6B, PMOS (P-channel metal oxide semiconductor) transistors Pai and Pbi form a first transistor and an NMOS (N-channel metal oxide semiconductor) transistor Ni forms a second transistor.

Figure 7:
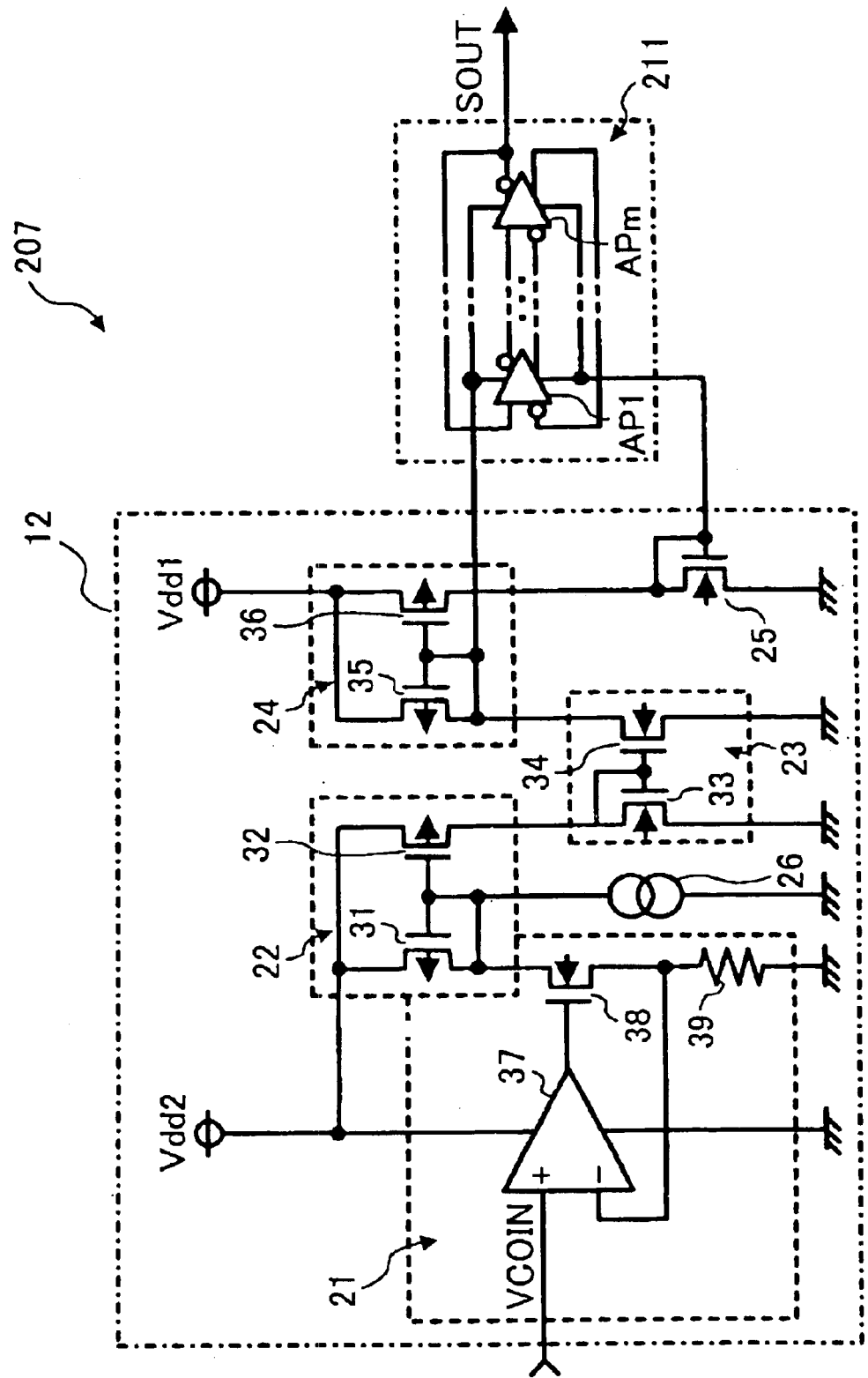
FIG. 7 is a schematic diagram of an exemplary PLL circuit using the differential amplifier according to another preferred embodiment.

FIG. 7 shows a VCO (voltage-controlled oscillator) 207 that uses a ring oscillator 211 composed of a plurality of differential amplifiers AP1–APm connected in a ring form, in which a suffix m is an odd integer greater than 1. That is, the VCO 207 is configured to perform a voltage-controlled oscillation in a similar manner as the VCO 7, except for its greater resistance to noise.

Numerous additional modifications and variations are possible in light of the above teachings. It is therefore to be understood that within the scope of the appended claims, the disclosure of this patent specification may be practiced otherwise than as specifically described herein.

This patent specification is based on Japanese patent application, No. 2001-259642 filed on Aug. 29, 2001, in the Japanese Patent Office, the entire contents of which are hereby incorporated by reference herein.

What is claimed is:

1. A phase-locked loop circuitry, comprising:

a comparator configured to compare phases of a reference clock signal and an output signal of said apparatus and to output a voltage in accordance with a difference in phase as a comparison result;

a filter configured to integrate the voltage output from said comparator;

a voltage-controlled oscillator configured to control a frequency of an output signal in accordance with the voltage output from said filter, said voltage-controlled oscillator comprising:

a ring oscillator configured to include a delay circuit including a plurality of inverters connected in a ring form;

a plurality of first transistors corresponding to said plurality of inverters of said ring oscillator on a one-to-one basis and configured to control a current supplied by a first power source voltage to a positive side power source terminal of each of said plurality of inverters;

a plurality of second transistors corresponding to said plurality of inverters of said ring oscillator on a one-to-one basis and configured to control a current output from a negative side power source terminal of each of said plurality of inverters;

a voltage-to-current converter configured to convert said voltage output from said filter into a current; and a plurality of current mirror circuits configured to output currents in accordance with the current output from said voltage-to-current converter to a control signal input terminal of each said plurality of first transistors and to a control signal input terminal of each of said plurality of second transistors;

wherein a portion of said voltage-controlled oscillator including said ring oscillator operates with a first power source voltage, and another portion of said voltage-controlled oscillator including said voltage-to-current converter operates with a second power source voltage greater than said first power source voltage.

2. A phase-locked loop circuitry as defined in claim 1, wherein said current mirror circuit comprises:

a first current mirror circuit configured to output a current in accordance with the current output from said voltage-to-current converter;

a second current mirror circuit configured to output a current in accordance with the current output from said first current mirror circuit to a control signal input terminal of each of said plurality of first transistors; and a third current mirror circuit configured to output a current in accordance with the current output from said second current mirror circuit to a control signal input terminal of each of said plurality of second transistors.

3. A phase-locked loop circuitry as defined in claim 2, wherein said first and second current mirror circuits operate with said second power source voltage, and said third current mirror circuit operates with said first power source voltage.

4. A phase-locked loop circuitry as defined in claim 2, wherein said voltage-to-current converter includes a constant current source configured to supply a predetermined constant current to said first current mirror circuit.

5. A phase-locked loop circuitry as defined in claim 2, wherein said third current mirror circuit includes a transistor with which each of said plurality of first transistors forms a current mirror circuit.

6. A phase-locked loop circuitry as defined in claim 2, wherein said voltage-to-current converter includes a transistor configured to form a current mirror circuit with each of said plurality of second transistors and to receive a current output from said third current mirror circuit.

7. A phase-locked loop circuitry, comprising:

a comparator configured to compare phases of a reference clock signal and an output signal of said apparatus and to output a voltage in accordance with a difference in phase as a comparison result;

a filter configured to integrate the voltage output from said comparator;

a voltage-controlled oscillator configured to control a frequency of an output signal in accordance with the voltage output from said filter, said voltage-controlled oscillator comprising:

a ring oscillator configured to include a delay circuit including a plurality of differential amplifiers connected in a ring form, each of said plurality of differential amplifier including a first transistor for controlling a current supplied to a corresponding one of said plurality of differential amplifiers by a first power source voltage and a second transistor for controlling a current output from a corresponding one of said plurality of differential amplifiers;

a voltage-to-current converter configured to convert said voltage output from said filter into a current; and a plurality of current mirror circuits configured to output currents in accordance with the current output from said voltage-to-current converter to a control signal input terminal of each of said plurality of first transistor and to a control signal input terminal of each of said plurality of second transistors;

wherein a portion of said voltage-controlled oscillator including said ring oscillator operates with a first power source voltage, and another portion of said voltage-controlled oscillator including said voltage-to-current converter operates with a second power source voltage greater than said first power source voltage.

8. A phase-locked loop circuitry as defined in claim 7, wherein said current mirror circuit comprises:

a first current mirror circuit configured to output a current in accordance with the current output from said voltage-to-current converter;

a second current mirror circuit configured to output a current in accordance with the current output from said first current mirror circuit to a control signal input terminal of said first transistor; and a third current mirror circuit configured to output a current in accordance with the current output from said second current mirror circuit to a control signal input terminal of said second transistor.

9. A phase-locked loop circuitry as defined in claim 8, wherein said first and second current mirror circuits operate with said second power source voltage, and said third current mirror circuit operates with said first power source voltage.

10. A phase-locked loop circuitry as defined in claim 8, wherein said voltage-to-current converter includes a constant current source configured to supply a predetermined constant current to said first current mirror circuit.

11. A phase-locked loop circuitry as defined in claim 8, wherein said third current mirror circuit includes a transistor with which said first transistor forms a current mirror circuit.

12. A phase-locked loop circuitry as defined in claim 8, wherein said voltage-to-current converter includes a transistor configured to form a current mirror circuit with said second transistor and to receive a current output from said third current mirror circuit.

13. A method of phase-locked looping, comprising the steps of:

providing step providing a ring oscillator including a plurality of inverters connected in a ring form;

comparing step comparing phases of a reference clock signal and an output signal of said ring oscillator;

generating step generating a voltage in accordance with a difference in phase as a comparison result;

integrating step integrating the voltage output from said generating step;

converting step converting said voltage output from said integrating step into a current;

a plurality of mirroring steps mirroring said current converted in said converting step to output first and second currents in accordance with the current output from said converting step;

first applying step applying said first current output in said mirroring steps to a plurality of first transistors corresponding to said plurality of inverters of said ring oscillator on a one-to-one basis to control a current supplied by a first power source voltage to a positive side power source terminal of each of said plurality of inverters; and second applying step applying said second current output in said mirroring steps to a plurality of second transistors corresponding to said plurality of inverters of said ring oscillator on a one-to-one basis to control a current output from a negative side power source terminal of each of said plurality of inverters, wherein said converting step operates with a second power source voltage greater than the first power source voltage, and said ring oscillator operates with said first power source voltage.

14. A method of phase locked looping, comprising the steps of:

providing step providing a ring oscillator including a plurality of differential amplifiers connected in a ring form, each of said plurality of differential amplifiers including first and second transistors;

comparing step comparing phases of a reference clock signal and an output signal of said ring oscillator;

generating step generating a voltage in accordance with a difference in phase as a comparison result;

integrating step integrating the voltage output from said generating step;

converting step converting said voltage output from said integrating step into a current;

a plurality of mirroring steps mirroring said current converted in said converting step to output first and second currents in accordance with the current output from said converting step;

first applying step applying said first current output in said mirroring steps to said first transistor included in each of said plurality of differential amplifiers of said ring oscillator to control a current supplied by a first power source voltage to each of said plurality of differential amplifiers; and second applying step applying said second current output in said mirroring steps to said second transistor included in each of said plurality of differential amplifiers of said ring oscillator to control a current output from a negative side power source terminal of each of said plurality of differential amplifiers, wherein said converting step operates with a second power source voltage greater than the first power source voltage, and said ring oscillator operates with said first power source voltage.

* * * * *